United States Patent
Amini et al.

(10) Patent No.: US 9,992,863 B2
(45) Date of Patent: Jun. 5, 2018

(54) CONNECTOR INSERTS AND RECEPTACLE TONGUES FORMED USING PRINTED CIRCUIT BOARDS

(71) Applicant: Apple Inc., Cupertino, CA (US)

(72) Inventors: Mahmoud R. Amini, Sunnyvale, CA (US); Zheng Gao, San Jose, CA (US); Dennis R. Pyper, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days. days.

(21) Appl. No.: 14/466,899

(22) Filed: Aug. 22, 2014

(65) Prior Publication Data

US 2015/0131245 A1    May 14, 2015

Related U.S. Application Data

(60) Provisional application No. 61/869,585, filed on Aug. 23, 2013, provisional application No. 61/905,275, filed on Nov. 17, 2013.

(51) Int. Cl.
*H05K 7/00* (2006.01)
*H05K 1/02* (2006.01)
(Continued)

(52) U.S. Cl.
CPC .............. *H05K 1/0296* (2013.01); *B23C 3/12* (2013.01); *B23C 5/04* (2013.01); *B23C 5/12* (2013.01);
(Continued)

(58) Field of Classification Search
CPC ........ B23C 2210/086; B23C 2210/088; B23C 2210/244; B23C 2220/16; B23C 2226/27;
(Continued)

(56) References Cited

U.S. PATENT DOCUMENTS

2003/0067048 A1* 4/2003 Lin .................... H01L 23/50
                                                        257/459
2005/0032347 A1   2/2005 Hase et al.
(Continued)

FOREIGN PATENT DOCUMENTS

EP    2 590 273 A2    5/2013
EP    2 613 414 A2    7/2013
(Continued)

OTHER PUBLICATIONS

International Preliminary Report on Patentability dated Mar. 3, 2016, for PCT Patent Application No. PCT/US2014/052538, 14 pages.
(Continued)

*Primary Examiner* — Yuriy Semenenko
(74) *Attorney, Agent, or Firm* — Kilpatrick Townsend & Stockton, LLP

(57) ABSTRACT

Connector inserts and other structures that have a high signal integrity and low insertion loss, are reliable, and are readily manufactured. One example may provide a connector insert formed primarily using a printed circuit board. Contacts on the connector insert may be akin to contacts on a printed circuit board and they may connect to traces having matched impedances on the printed circuit board in order to improve signal integrity and reduce insertion loss. The printed circuit board may be manufactured in a manner for increased reliability. Plating, solder block, and other manufacturing steps that are native to printed circuit board manufacturing may be employed to improve manufacturability. Specialized tools that may provide a chamfered edge on the connector inserts may be employed.

20 Claims, 20 Drawing Sheets

(51) Int. Cl.
*B23C 3/12* (2006.01)
*H01R 13/66* (2006.01)
*H01R 24/60* (2011.01)
*H05K 3/06* (2006.01)
*B23C 5/04* (2006.01)
*B23C 5/12* (2006.01)
*H01R 13/6473* (2011.01)
*H05K 3/10* (2006.01)
*H05K 3/24* (2006.01)
*H05K 1/18* (2006.01)
*H05K 3/00* (2006.01)

(52) U.S. Cl.
CPC ......... *H01R 13/6658* (2013.01); *H01R 24/60* (2013.01); *H05K 3/06* (2013.01); *H05K 3/10* (2013.01); *B23C 2210/086* (2013.01); *B23C 2210/088* (2013.01); *B23C 2210/244* (2013.01); *B23C 2220/16* (2013.01); *B23C 2226/27* (2013.01); *H01R 13/6473* (2013.01); *H01R 2201/06* (2013.01); *H05K 1/025* (2013.01); *H05K 1/0227* (2013.01); *H05K 1/181* (2013.01); *H05K 3/0044* (2013.01); *H05K 3/108* (2013.01); *H05K 3/243* (2013.01); *H05K 3/244* (2013.01); *H05K 2201/09027* (2013.01); *H05K 2201/09081* (2013.01); *H05K 2201/09154* (2013.01); *H05K 2201/09354* (2013.01); *H05K 2201/09445* (2013.01); *H05K 2203/1469* (2013.01)

(58) Field of Classification Search
CPC .... B23C 3/12; B23C 5/04; B23C 5/12; H01R 13/6473; H01R 13/6658; H01R 2201/06; H01R 24/60; H05K 1/0227; H05K 1/025
See application file for complete search history.

(56) References Cited

U.S. PATENT DOCUMENTS

| | | | | |
|---|---|---|---|---|
| 2005/0202727 | A1* | 9/2005 | Andre | H01R 12/7088 439/660 |
| 2006/0040549 | A1* | 2/2006 | Yao | H01R 29/00 439/502 |
| 2010/0044084 | A1 | 2/2010 | Lee et al. | |
| 2010/0101849 | A1* | 4/2010 | Sunohara | H01L 23/5383 174/260 |
| 2011/0199729 | A1* | 8/2011 | Hsieh | H01R 13/193 361/679.33 |
| 2013/0175326 | A1* | 7/2013 | Jol | B23K 1/0016 228/176 |
| 2014/0355228 | A1* | 12/2014 | Shi | H05K 3/36 361/749 |

FOREIGN PATENT DOCUMENTS

| | | |
|---|---|---|
| JP | H01287990 A | 11/1989 |
| JP | H08279667 A | 10/1996 |
| JP | 2000-505601 A | 5/2000 |
| JP | 2001242195 A | 9/2001 |
| JP | 2003332721 A | 11/2003 |
| JP | 2004363032 A | 12/2004 |
| JP | 2007088056 A | 4/2007 |
| JP | 2010251554 A | 11/2010 |
| JP | 2013-532351 A | 8/2013 |
| JP | 2013-533503 A | 8/2013 |
| WO | 97/32456 A1 | 9/1997 |
| WO | 2011/150403 A1 | 12/2011 |
| WO | 2011/153132 A1 | 12/2011 |

OTHER PUBLICATIONS

International Search Report and Written Opinion of the International Searching Authority dated May 6, 2015 for PCT Patent Application No. PCT/US2014/052538, 19 pages.
Invitation for Pay Additional Fees and, Where Applicable, Protest Fee with Partial International Search Report dated Dec. 3, 2014 for PCT Patent Application No. PCT/US2014/052538, 6 pages.
Examination Report No. 1 dated Jan. 31, 2017 in Australian Patent Application No. 2014308574, 4 pages.
Office Action (English Translation) dated Feb. 24, 2017 in Japanese Patent Application No. 2016-536509, 7 pages.
Office Action (English Translation) dated Mar. 2, 2017 in Chinese Patent Application No. 201480046671X, 9 pages.
Office Action (English Translation) dated Mar. 16, 2017 in Taiwan Patent Application No. 103129086, 2 pages.
Office Action(English Translation) dated Mar. 20, 2017 in Korean Patent Application No. 10-2016-7004673, 4 pages.
Office Action (English translation) dated Sep. 7, 2017 in Korean Patent Application No. 10-2016-7004673, 4 pages.

* cited by examiner

CONNECTOR INSERTS AND RECEPTACLE TONGUES FORMED USING PRINTED CIRCUIT BOARDS

CROSS-REFERENCES TO RELATED APPLICATIONS

This application claims the benefit of U.S. provisional patent applications No. 61/869,585, filed Aug. 23, 2013, and 61/905,275, filed Nov. 17, 2013, which are incorporated by reference.

BACKGROUND

The amount of data transferred between electronic devices has grown tremendously the last several years. Large amounts of audio, streaming video, text, and other types of data content are now regularly transferred among desktop and portable computers, media devices, handheld media devices, displays, storage devices, and other types of electronic devices.

These data transfers may occur over various media. For example, the data transfers may be made wirelessly, over wire conductors, over fiber optic cables, or they may be made in other ways. Power may be transferred with the data, or power may be transferred separately. For example, power and data may be transferred from one electronic device to another, or power may be separately transferred from a battery, charging circuit, or power converter to an electronic device.

Power and data may be conveyed over cables that may include wire conductors, fiber optic cables, or some combination of these or other conductors. Cable assemblies may include a connector insert at each end of a cable, though other cable assemblies may be connected or tethered to an electronic device in a dedicated manner. The connector inserts may be inserted into receptacles in the communicating electronic devices.

Again, the data rates through these connector inserts and receptacles may be quite high. To provide these high data rates, it may be desirable that the connector inserts and receptacles have a high signal integrity and low insertion loss.

Also, these connector inserts may be inserted into a device receptacle once or more each day for multiple years. It may be desirable that these connector inserts and receptacles are reliable and do not break or wear down prematurely. Such failures may lead to user dissatisfaction with both the cable assembly and the electronic devices that it connects to.

Electronic devices may be sold in the millions, with an attendant number of cable assemblies and their connector inserts sold with them. With such volumes, any reduction or simplification in the manufacturing becomes significant. For such reasons, it may be desirable that these connector inserts and receptacles are readily manufactured.

Thus, what is needed are connector inserts and receptacles that have high signal integrity and low insertion loss, are reliable, and are easy to manufacture.

SUMMARY

Accordingly, embodiments of the present invention may provide connector inserts and receptacles and other structures that have a high signal integrity and low insertion loss, are reliable, and are readily manufactured.

An illustrative embodiment of the present invention may provide connector inserts and receptacles having a high signal quality by simplifying their physical signal path. In one embodiment, a connector insert or tongue of a connector receptacle may be formed primarily of a printed circuit board. Contacts on the connector inserts or receptacle tongues may be akin to conventional contacts on a printed circuit board. These contacts may have reduced size to decrease contact-to-contact and other stray capacitance. This reduced size may also help limit reflections that may otherwise occur from stub-effects within the contact. Resistance may also be reduced. These reductions in capacitance, stub-effects, and resistance may help improve signal quality, reduce insertion loss, and help improve impedance matching.

In a specific embodiment of the present invention, a width of the contacts may be determined by an alignment tolerance and may not be easily reduced. Similarly, a length of the contact may provide a necessary amount of wiping and may not be readily reduced. Accordingly, in this specific embodiment of the present invention, a height or profile of each contact may be reduced. This reduction in height reduces a capacitance from a side of a contact to a neighboring side of an adjacent contact or other nearby structures. This reduction in height may help to reduce the length of extraneous paths in the contact, thereby reducing the stub-effect. It may also help to reduce contact resistance. Again, the cumulative effect of these improvements may be to help improve signal quality, reduce insertion loss, and help improve impedance matching.

Embodiments of the present invention may route traces through the printed circuit board to these contacts. These traces may be matched impedance lines. For example, strip line impedance techniques may be employed in routing signals away from the contacts through the printed circuit board.

Embodiments of the present invention may include one or more electronic circuits, devices, components, or combination thereof, on the printed circuit board. These circuits, devices, and components may include light-emitting diodes, power converters, clock and data recovery circuits, and other electronic circuits, devices, or components. A cable assembly may be formed by attaching a cable to the connector insert, typically at a portion of the connector insert away from the contacts. Printed circuit board traces from the contacts may connect to one or more of the electronic circuits, devices, or components, to one or more conductors in the cable, or to other structures. A housing may be provided over or around these electronic circuits, devices, or components to increase connector insert usability.

An illustrative embodiment of the present invention may provide a connector insert or receptacle tongue that is reliable by using a printed circuit board that is constructed to have a reduced chance of breakage. For example, fibers in one or more layers of the printed circuit board may be oriented to improve the reliability of the connector insert. In these and other embodiments, the fiber content, type of fibers, or other parameters may be adjusted to improve the reliability of the connector inserts.

An illustrative embodiment of the present invention may provide a connector insert or receptacle tongue that is readily manufactured. A specific embodiment may provide a connector insert or receptacle tongue that is formed primarily of a printed circuit board and is primarily manufactured using conventional printed circuit board manufacturing techniques. In this specific embodiment, one or more electronic devices may be placed on a printed circuit board. Ground rings, contacts, and traces or connections on the printed circuit board may be metalized using steps limited to or including conventional printed circuit board metallization techniques. The printed circuit board may be shaped to fit in a corresponding connector receptacle and the contacts may be arranged to mate with contacts in the connector receptacle. In various embodiments of the present invention, a solder mask may be placed over the printed circuit board and etched to cover one or more non-metalized areas. In still other embodiments a label or coverlay may be placed in one or more non-metalized areas. For example, a coverlay may be hot pressed onto a connector insert to cover an area between contacts and between contacts and a ground ring. In still other embodiments, plastic may be placed in these areas. In these embodiments, the solder mask, label, plastic, or coverlay may have various colors and textures such that they provide acceptable cosmetics when exposed to a user.

Another illustrative embodiment of the present invention may provide a method of manufacturing a connector insert or receptacle tongue. This method may include placing one or more electronic devices may be on a printed circuit board. Copper or other plating may be placed on the printed circuit board and etched to form ground rings, contacts, traces, and connections to the one or more electronic devices. Nickel or other plating may be etched to cover the copper. The contacts may be plated with gold or other material to reduce oxidation and improve electrical contact. Chromium, palladium-nickel (PdNi), or other plating may be etched to cover the non-contact metalized areas. The metalized areas may reduce wear caused by contact with retention features, spring contacts, or other features in a corresponding connector. A solder mask may be placed over the printed circuit board and etched to cover the non-metalized areas, or a label or coverlay may be placed over these areas Embodiments of the present invention may expose a printed circuit board to direct use and handling by a user. Conventionally, this may have had little appeal due to the rough, unpolished characteristics of at least some portions of printed circuit boards. Accordingly, another illustrative embodiment of the present invention may provide a connector insert that is both pleasurable to look at and touch despite its being made at least primarily using a printed circuit board. The feel of a connector insert may be improved by providing a chamfered edge between one or both of a top and bottom and the sides of the connector insert or receptacle tongue. The chamfered edge may be machined by using a router that has a longitudinal axis and is cylindrical in the longitudinal axis, and further has one or more raised portions orthogonal to the longitudinal axis. The one or more raised portions may have an upper angled portion and a lower angled portion. The angled portions may be used to machine away edge portions along tops and bottoms of the connector insert thereby leaving a chamfered edge behind. The upper angled portion and the lower angled portion may be curved to give the resulting chamfered edge a curve. For example, the upper angled portion and the lower angled portion may be concave to give the chamfered edges a convex curved edge, though any combination of concave, straight, and convex edges may be used. The router may have a number of raised portions and may form chamfered edges on a stack of printed circuit boards at the same time. The raised portions may further have a flat portion between each upper angled portion and lower angled portions. Spacers or inserts having a height approximately equal to a height of a flat portion may be inserted between each printed circuit board in the stack during machining.

Again, embodiments of the present invention may provide a connector insert or receptacle tongue having an improved appearance. Ordinarily, a printed circuit board may provide a rough side edge. A connector insert or receptacle tongue made from a printed circuit board may suffer the same defect. Accordingly, embodiments of the present invention may reduce or compensate for this roughness. In a specific embodiment of the present invention, a fine router, such as the router described above, may be used to provide a more smooth or polished side. In another specific embodiment of the present invention, the metallization of at least one or more sides of a connector insert have an increased thickness. This increased thickness may help to smooth over any stray fibers or unevenness along sides of the connector insert. In another specific embodiment of the present invention, one or more sides of the connector insert may be metalized. The metallization may then be thinned to help smooth over any unevenness along sides of the connector insert.

Embodiments of the present invention may utilize this ability to expose printed circuit boards to use and handling by users to provide other structures as well as connector inserts. For example, an embodiment of the present invention may provide a connector receptacle having a tongue, where the tongue is manufactured using one or more of the embodiments of the present invention or features described herein. Another specific embodiment of the present invention may provide a printed circuit board for an electronic device, where a portion of the printed circuit board is formed to provide a tongue. The tongue may be used as a tongue for a receptacle on the electronic device.

Shielding may be improved in these inserts and tongues by placing a ground or other plane on a central layer of the printed circuit board. This ground plane may isolate signals on a top of the insert or tongue from signals on a bottom of the insert or tongue.

Embodiments of the present invention may provide connector inserts for cables that may connect to various types of devices, such as portable computing devices, tablets, desktop computers, laptops, all-in-one computers, cell phones, smart phones, media phones, storage devices, portable media players, navigation systems, monitors, power supplies, adapters, and chargers, and other devices. These connector inserts may provide pathways for signals and power compliant with various standards such as Universal Serial Bus (USB), a High-Definition Multimedia Interface (HDMI), Digital Visual Interface (DVI), power, Ethernet, DisplayPort, Thunderbolt, Lightning and other types of standard and non-standard interfaces.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
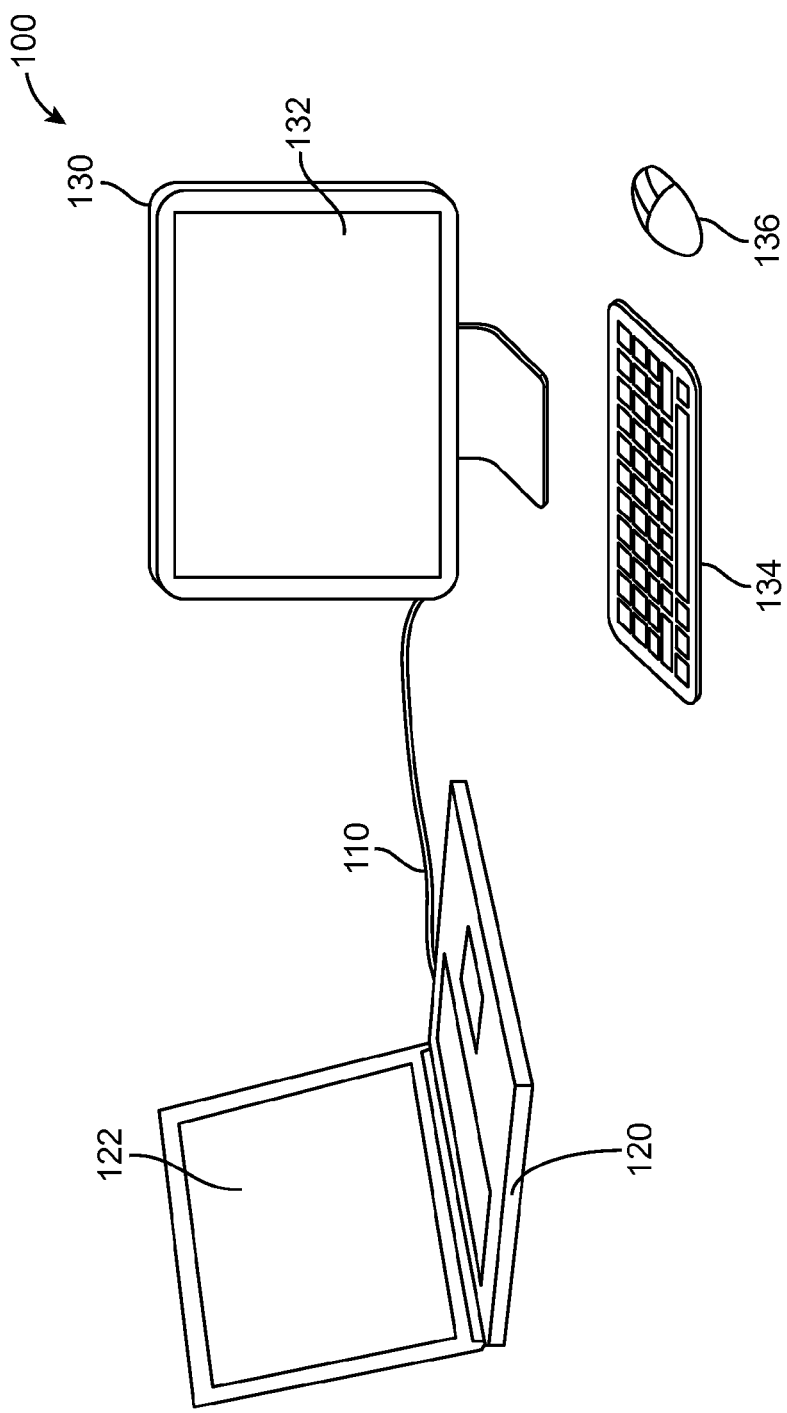
FIG. 1 illustrates an electronic system that may be improved by the incorporation of embodiments of the present invention.

FIG. 1 illustrates an electronic system that may be improved by the incorporation of embodiments of the present invention. This figure, as with the other included figures, is shown for illustrative purposes and does not limit either the possible embodiments of the present invention or the claims.

Electronic system 100 may include cable 110 joining electronic devices 120 and 130. Electronic device 120 may be a laptop or portable computer having screen 122. Electronic device 130 may be an all-in-one computer including screen 132, keyboard 134, and mouse 136. In other embodiments of the present invention, cable 110 may couple various types of devices, such as portable computing devices, tablets, desktop computers, cell phones, smart phones, media phones, storage devices, portable media players, navigation systems, monitors power supplies, adapters, and chargers, and other devices. These cables, such as cable 110, may provide pathways for signals and power compliant with various standards such as Universal Serial Bus (USB), a High-Definition Multimedia Interface (HDMI), Digital Visual Interface (DVI), power, Ethernet, DisplayPort, Thunderbolt, Lightning and other types of standard and non-standard interfaces. Cable 110 may attach to electronic devices 110 and 130 using connector inserts provided by embodiments of the present invention. Other cables (not shown) may connect to connector inserts provided by embodiments of the present invention and may be used to provide charging power to devices such as keyboard 134 and mouse 136, as well as remote controls and other electronic devices.

Again, embodiments of the present invention may provide connector inserts formed at least primarily of a printed circuit board. Exposing a printed circuit board to direct use and handling by a user in this way may be enabled by employing various techniques provided by embodiments of the present invention. One such connector insert is shown in the following figure.

Figure 2:
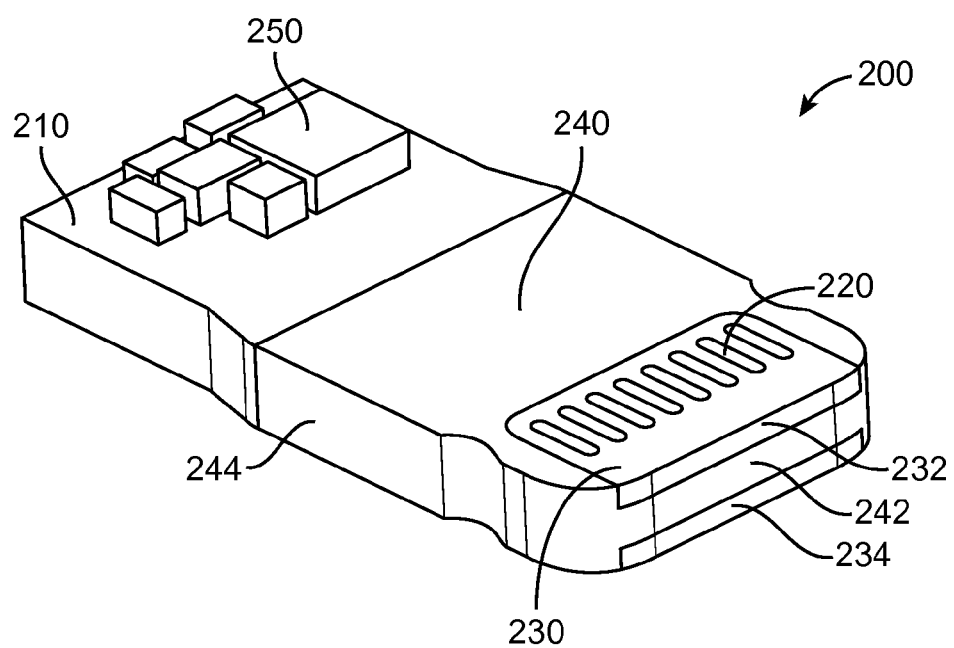
FIG. 2 illustrates a connector insert according to an embodiment of the present invention.

FIG. 2 illustrates a connector insert according to an embodiment of the present invention. Connector insert 200 may include a printed circuit board 200, which may support a number of electronic devices, circuits, or components 250. Connector insert 200 may further include contacts 220 surrounded by ground ring 240. An isolation or solder mask area 230 may isolate contacts 220 from ground ring 240. Ground ring 240 may include side portions 244 and front portion 242. Front portion 242 of ground ring 240 may be surrounded by isolation or solder mask areas 232 and 234. Other contacts arranged similarly to contacts 220 may be included on an underside of connector insert 200, and they may be surrounded by a corresponding solder mask area and underside portion of ground ring 240. While in this example a solder mask area 230 is shown, in still other embodiments of the present invention, a label or coverlay may be placed in one or more non-metalized areas. Again, a coverlay may be hot pressed onto a connector insert to cover an area between contacts and between contacts and a ground ring. In these embodiments, the solder mask, label, or coverlay may have various colors and textures such that they provide acceptable cosmetics when exposed to a user.

Again, embodiments of the present invention may provide connector inserts having high signal integrity and reduced insertion losses. This may be accomplished in part by reducing a size of contacts 220. Contacts 220 may have a width that is not easily reduced because it is necessitated by alignment tolerances. Contacts 220 may also have a length that is necessitated by a desire to have a certain wipe length. Accordingly, embodiments of the present invention may reduce a height or profile of contacts 220. This reduction in height may reduce contact-to-contact capacitance through sidewalls of contacts 220 as well as stray capacitance to other structures, such as ground ring 240. This reduction in profile may further reduce length of stray metallization does not directly in a signal path in order to reduce stub-effects. This reduction in height may also reduce contact resistance. The cumulative effect of these improvements may be to improve signal integrity and lower insertion losses.

A cable assembly may be formed by attaching a cable to connector insert 200, typically at a portion of connector insert 200 away from contacts 220. Contacts 220, and corresponding contacts on underside of connector insert 200, may connect to one or more electronic devices, circuits, or components 250, or to one or more conductors in the cable. These connections may be through matched impedance lines formed by traces on one or more layers in printed circuit board 210.

Figure 3:
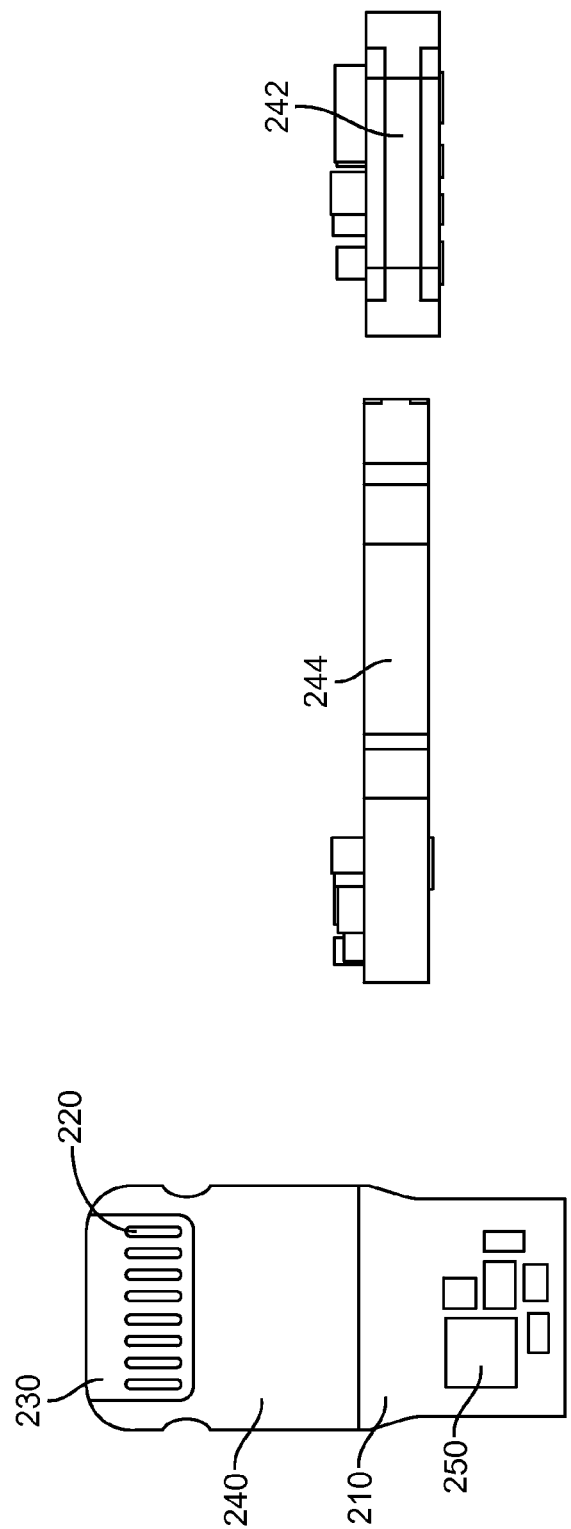
FIG. 3 illustrates top, side, and front views of a connector insert according to an embodiment of the present invention.

FIG. 3 illustrates top, side, and front views of a connector insert according to an embodiment of the present invention. Again, connector insert 200 may be formed primarily of printed circuit board 210 and may support one or more electronic devices, circuits, or components 250. Ground ring 240 may surround contacts 220. Isolation or solder mask 230 may isolate contacts 220 from each other and from ground ring 240. Ground ring 240 may include side portions 244 and front portion 242. Again, instead of an isolation mask 230, a label or coverlay may be used to isolate contacts 220 from each other and from ground ring 240.

Embodiments of the present invention may provide connector inserts that are readily manufactured by utilizing one or more conventional printed circuit board manufacturing steps in its construction. In such a method, electronic devices may be placed on printed circuit board, and structures such as ground rings, contacts, and traces may be metallized on the printed circuit board. Solder mask areas may be then formed for isolation and trace protection. One such method is shown in the following figures.

Figure 4:
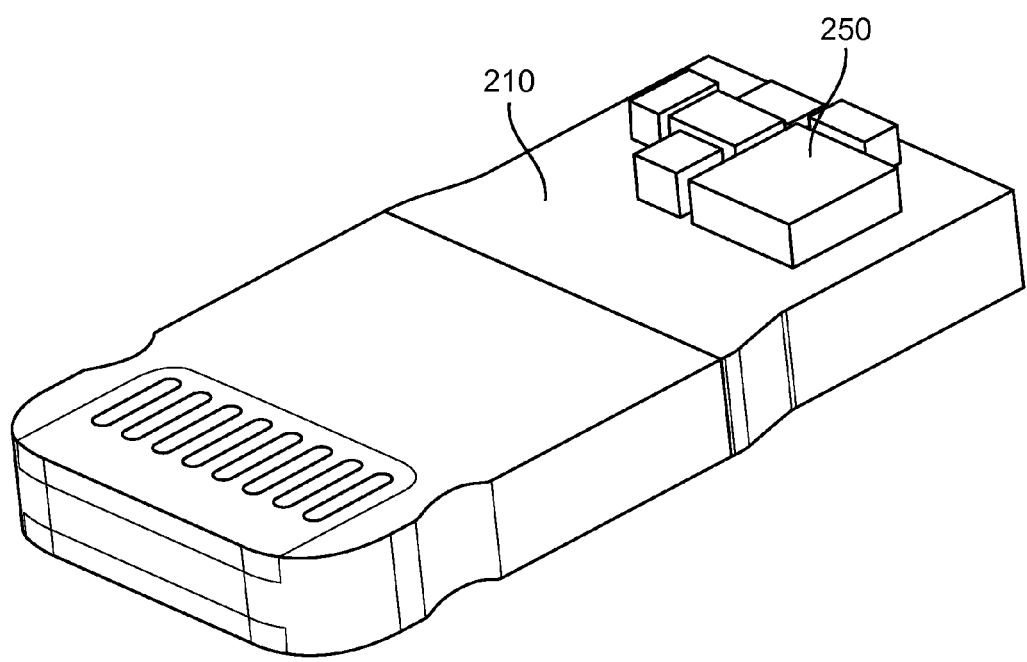
FIGS. 4 through 10 illustrates a method of manufacturing a connector insert according to an embodiment of the present invention.

FIGS. 4 through 10 illustrates a method of manufacturing a connector insert according to an embodiment of the present invention. FIG. 4 illustrates a portion of a connector insert during its manufacture. In FIG. 4, printed circuit board portion 210 has been shaped to fit in a corresponding connector receptacle. One or more electronic devices, circuits, or components 250 have been placed on printed circuit board 210. These may be surface mount or through-hole devices, circuits, or components.

Again, embodiments of the present invention may provide connector inserts that are reliable. In various embodiments of the present invention, reliability may be improved by using specific types of printed circuit boards, such as FR4, as printed circuit board 210. Also, embodiments of the present invention may vary fiber content, fiber direction, and other parameters to improve the reliability of resulting connector inserts.

Figure 5:
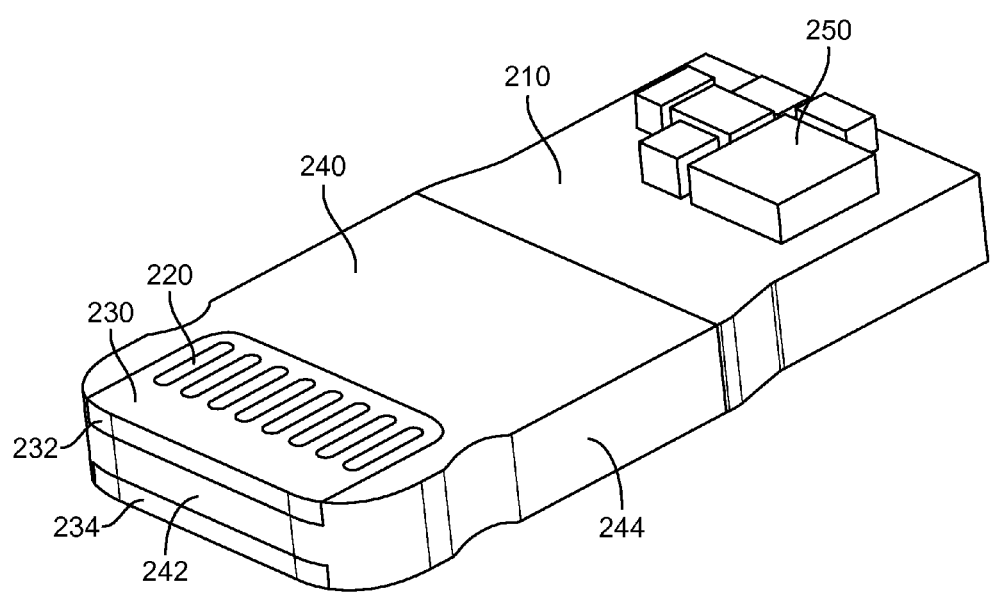

FIG. 5 illustrates a portion of a connector insert after a layer of copper plating has been applied. Specifically, ground ring 240, including side portion 244 and front portion 242, and contacts 220 may have been metallized on printed circuit board 210. Also, traces and contacts to electronic devices, circuits, and components 250 may have been metallized.

In this and the following metallization steps, a metal, in this case copper or other material, may have been deposited via sputtering or vaporization on printed circuit board 210. A resist coating may then be applied. This resist may be masked and exposed to light. An etch may be used to remove resist and metal from areas such as open areas 230, 232, and 234.

Figure 6:
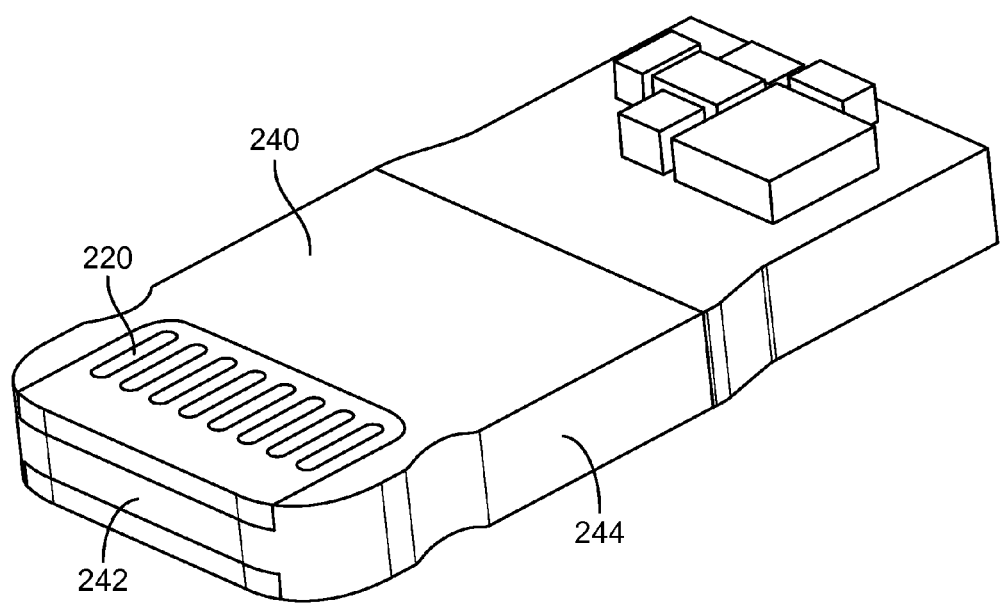

In FIG. 6, a layer of nickel or other material may be applied to ground ring 240 including side portions 244 and front portions 242, as well as to contacts 220.

Figure 7:
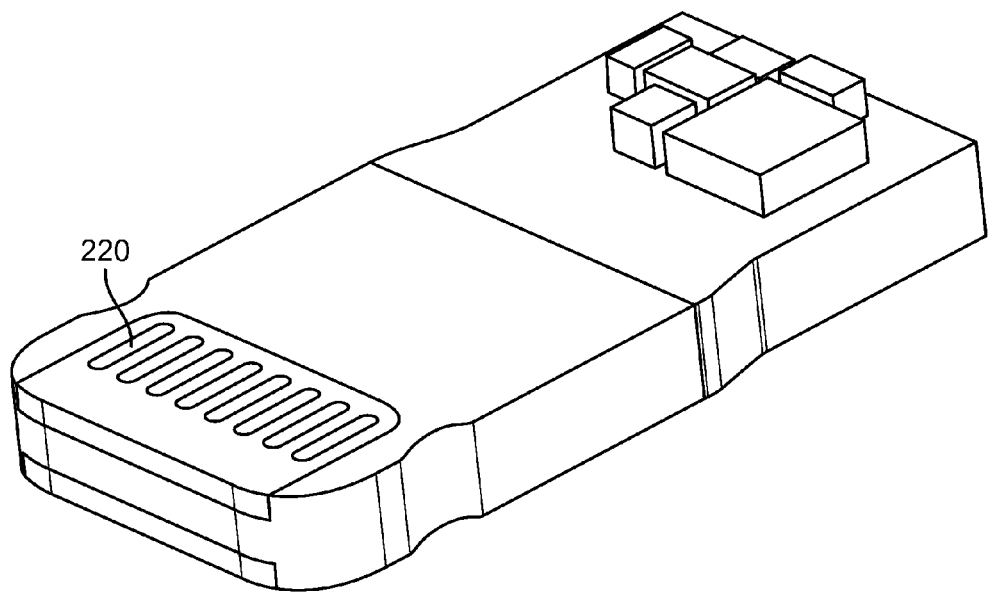

In FIG. 7, contacts 220 may be gold plated, or plated with another material.

Figure 8:
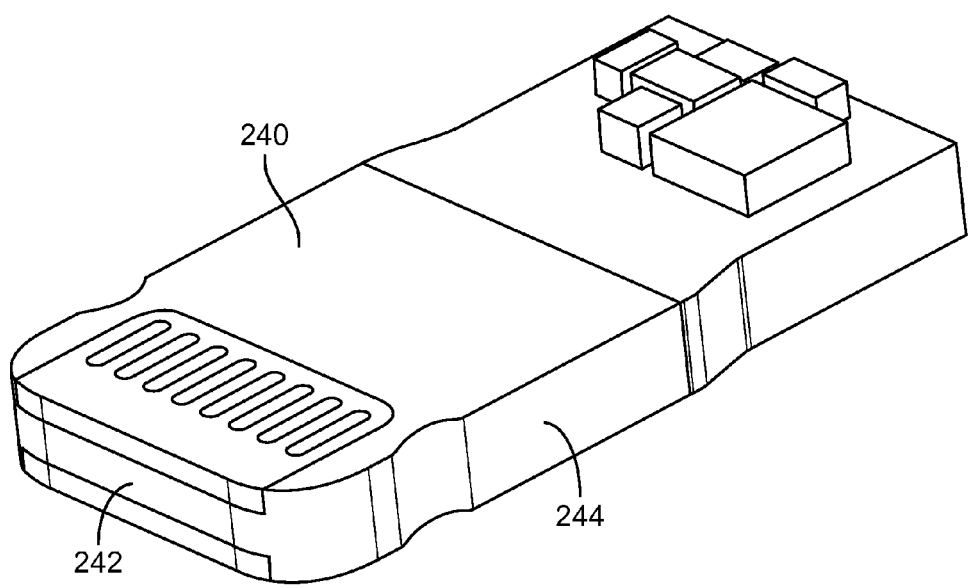

In FIG. 8, chromium plating may be applied to ground ring 240 including side portions 244 and front portion 242. In other embodiments, this plating may be palladium-nickel or other material.

Figure 9:
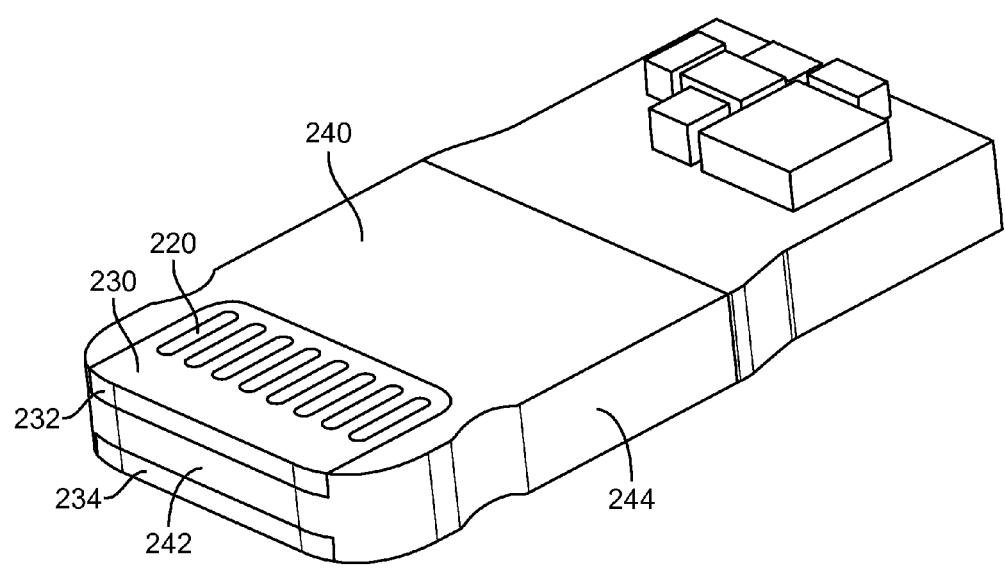

In FIG. 9, a solder mask or isolation layer may be applied to the printed circuit board. This may be done using an E-spray process or by other traditional techniques. In still other embodiments, a coverlay or label may be applied, for example a coverlay may be hot pressed to the connector insert.

Figure 10:
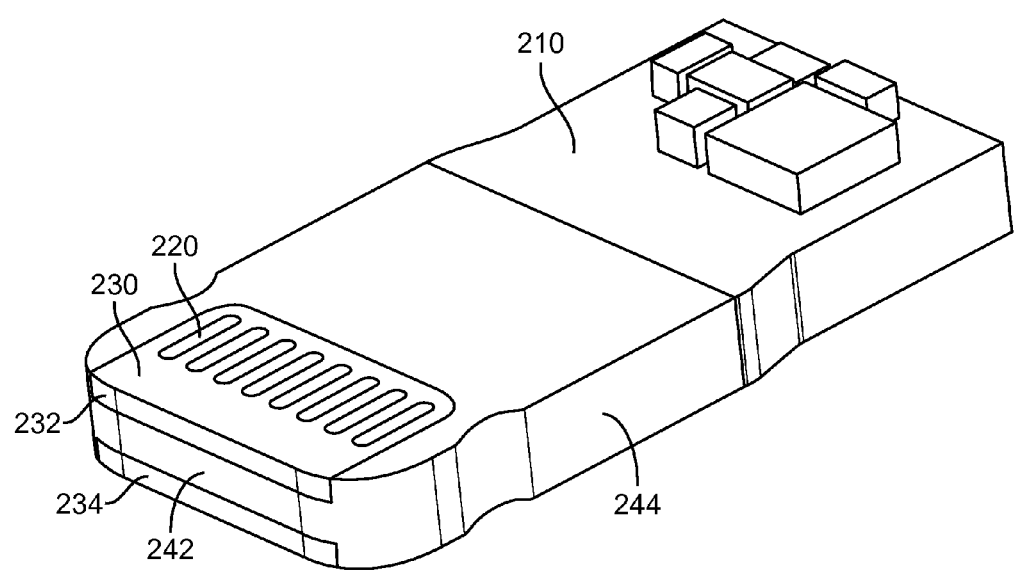

In FIG. 10, the solder resists has been etched back to cover areas 230, 232, and 234. This solder resist mask may also be used to protect other portions of printed circuit board 210.

Again, one or more of these metallizations and other steps may be conventional printed circuit board manufacturing steps. Flowcharts illustrating methods of manufacturing connector inserts in other structures according to embodiments of the present invention are shown in the following figure.

Figure 11A:
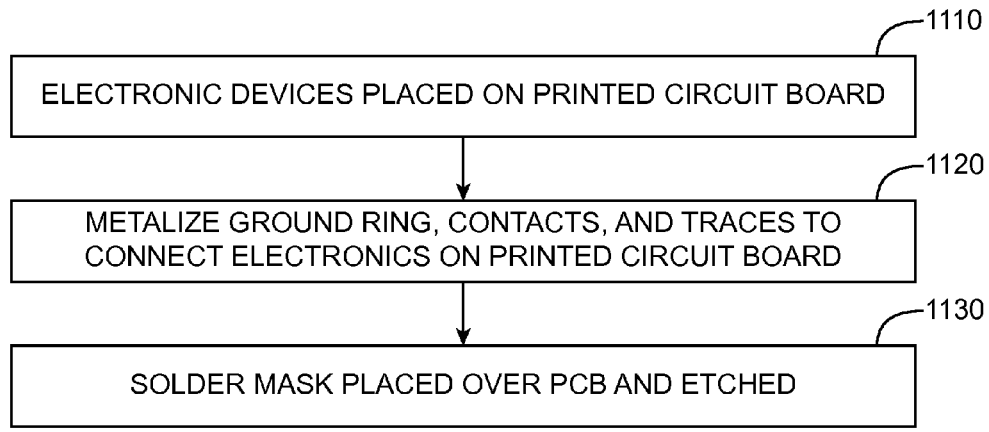
FIGS. 11A and 11B are flowcharts of methods of manufacturing a connector insert or other structure according to an embodiment of the present invention.

FIG. 11A is a flowchart of a method of manufacturing a connector insert or other structure according to an embodiment of the present invention. In act 1110, electronic devices, circuits, or components may be placed on a printed circuit board. Structures such as ground rings, contacts, and traces may be metallized on printed circuit board in act 1120. In act 1130, solder mask may be placed on printed circuit board and etched, or a label or coverlay may be applied.

Figure 11B:
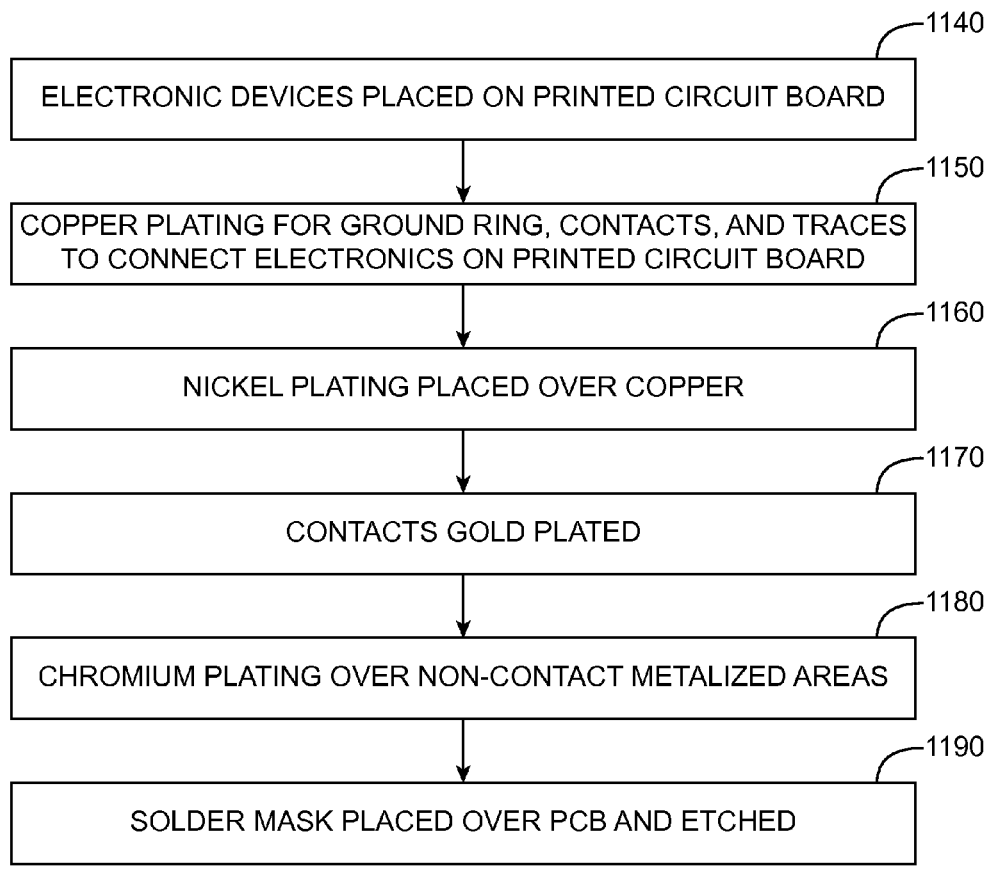

FIG. 11B is another flowchart of a method of manufacturing a printed circuit board according to an embodiment of the present invention. As before, electronic devices, circuits, or components may be placed on a printed circuit board in act 1140. Copper or other plating for ground ring, contacts, and traces to connect the electronics may be metallized on printed circuit board in act 1150. A nickel or other type of plating may be placed over the copper plating in act 1160. Contacts may be gold plated or plated with another material in act 70. Chromium, palladium-nickel, or other plating may be placed on the noncontact metallized areas in act 1180. Solder mask may be placed on the printed circuit board and etched in act 1190, or a label or coverlay may be applied. A cable may be attached to the connector insert, and a housing may be used to cover at least electronic devices, circuits, and components 250 and the surrounding non-metallized area.

Again, embodiments of the present invention may expose printed circuit boards for use and handling by a user. Conventionally, this may have been undesirable as portions of printed circuit boards, particularly edges and corners, have had a rough feel and appearance. Accordingly, embodiments of the present invention provide connector inserts and other structures formed primarily of printed circuit boards, where the connector inserts and other structures have a desirable appearance and feel.

Embodiments of the present invention may reduce the roughness of printed circuit boards, particularly along the edges. In one embodiment of the present invention, a connector insert or other structure may be shaped by a router having a very fine bit. Use of a fine bit may provide a smooth or polished edge to the printed circuit board. In other embodiments, the metallization along a side of a printed circuit board may be relatively thick in order to cover any stray fibers or unevenness. In still other embodiments of the present invention, the metallization on the printed circuit board may be thinned to remove or reduce uneven surface features. In still other embodiments of the present invention, edges of the connector insert may be smoothed or chamfered to provide a more desirable feel to a user. An example is shown in the following figure.

Figure 12:
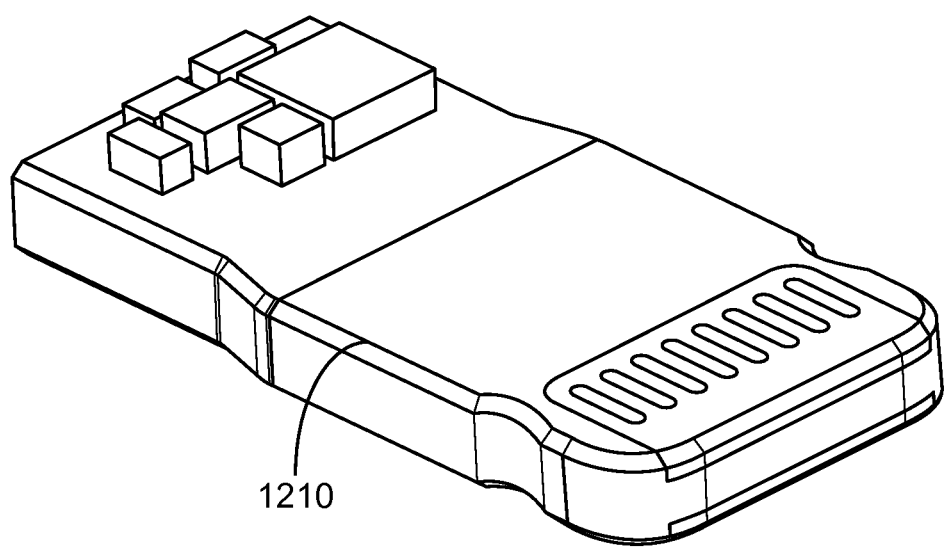
FIG. 12 illustrates a portion of a connector insert having a chamfered edge according to an embodiment of the present invention.

FIG. 12 illustrates a portion of a connector insert having a chamfered edge according to an embodiment of the present invention. In this example, an edge between a top and side of the connector insert has a chamfered edge 1210. A similar chamfered edge may be formed between a bottom and side of the connector insert.

Figure 13:
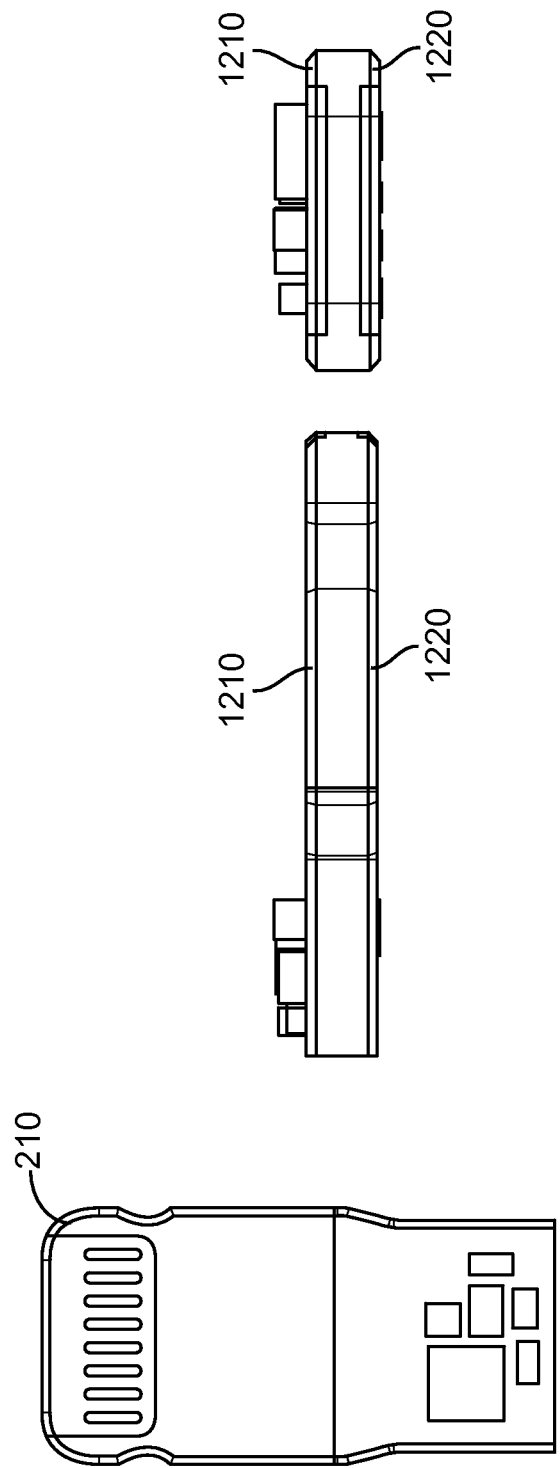
FIG. 13 illustrates a portion of a connector insert having a chamfered edge according to an embodiment of the present invention.

FIG. 13 illustrates a portion of a connector insert having a chamfered edge according to an embodiment of the present invention. Again, the connector insert may include chamfered edges 1210 and 1220.

It is often desirable to shape several printed circuit boards at the same time during manufacturing. Often these printed circuit boards may be stacked one on top of another to have their edges cut by a router. Accordingly, embodiments of the present invention may provide a method of forming chamfered edges on connector inserts or other structures for each printed circuit board in a stack. An example is shown in the following figure.

Figure 14:
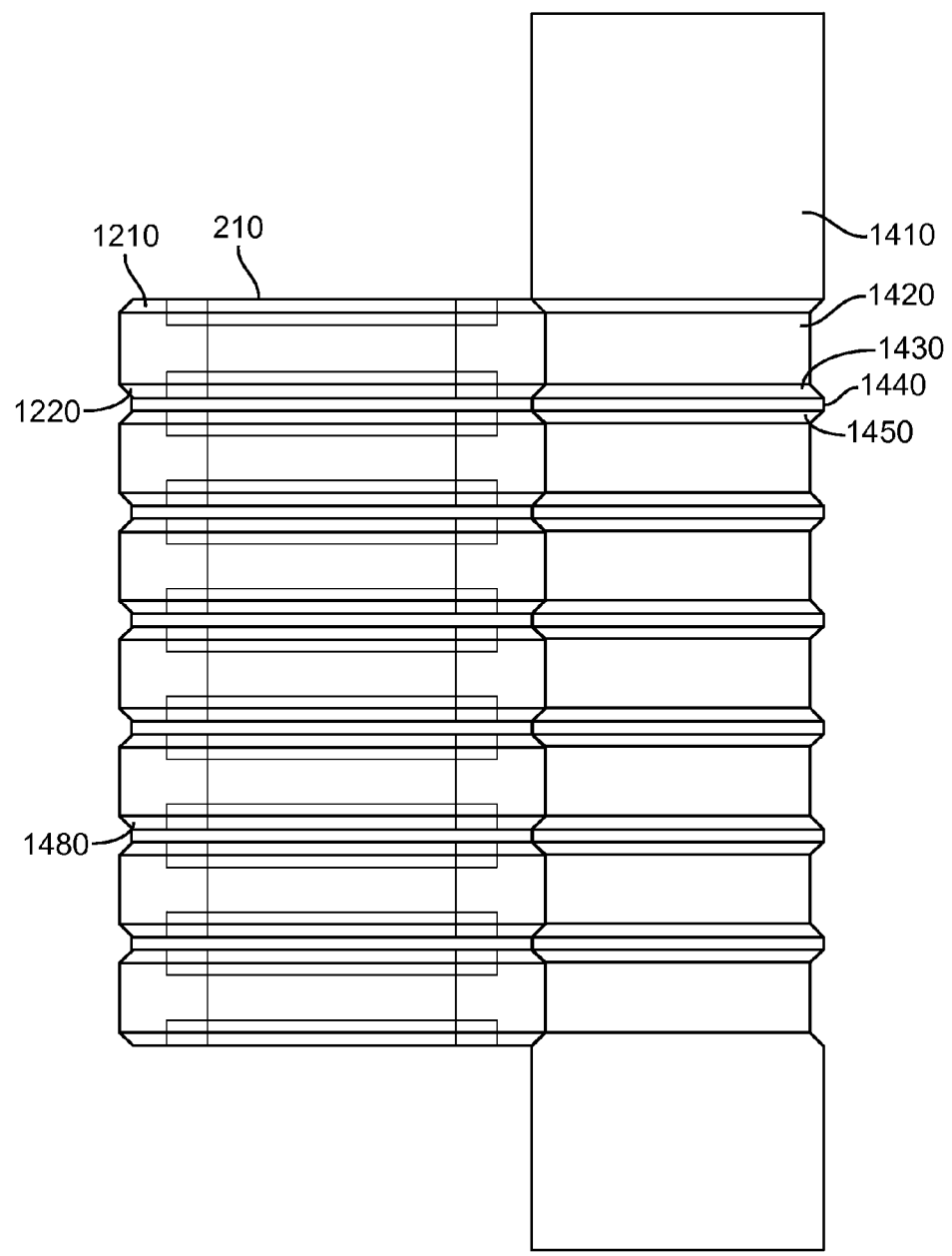
FIG. 14 illustrates a router that may be used to form chamfered edges on connector inserts or other structures according to an embodiment of the present invention.

FIG. 14 illustrates a router that may be used to form chamfered edges on connector inserts or other structures according to an embodiment of the present invention. Router 1410 may be cylindrical in a longitudinal direction and have one or more raised portions 1440 that are substantially orthogonal to the longitudinal direction. The one or more raised portions may include upper angled edges 1430 and lowered angled edges 1450. Flat surfaces 1420 may be provided and used to shape printed circuit boards 210. Upper angled edges 1430 and lower angled edges 1450 may be used to generate chamfered edges 1210 and 1220 on adjacent printed circuit boards 210 in the stack. Raised portions 1420 may include a flat surface between upper angled portions 1430 and lowered angled portions 1450. This flat surface may have a height that corresponds to a height or thickness of spacers 1480 that may be located between printed circuit boards 210 in the stack.

In various embodiments of the present invention, chamfered edges 1210 and 1220 may have concave, convex, or flat surfaces. These may be formed by corresponding convex, concave, or flat surfaces on upper angled portions 1430 and lower angled portions 1450.

Again, embodiments of the present invention may provide other structures as well as connector inserts. Examples are shown in the following figures.

Figure 15:
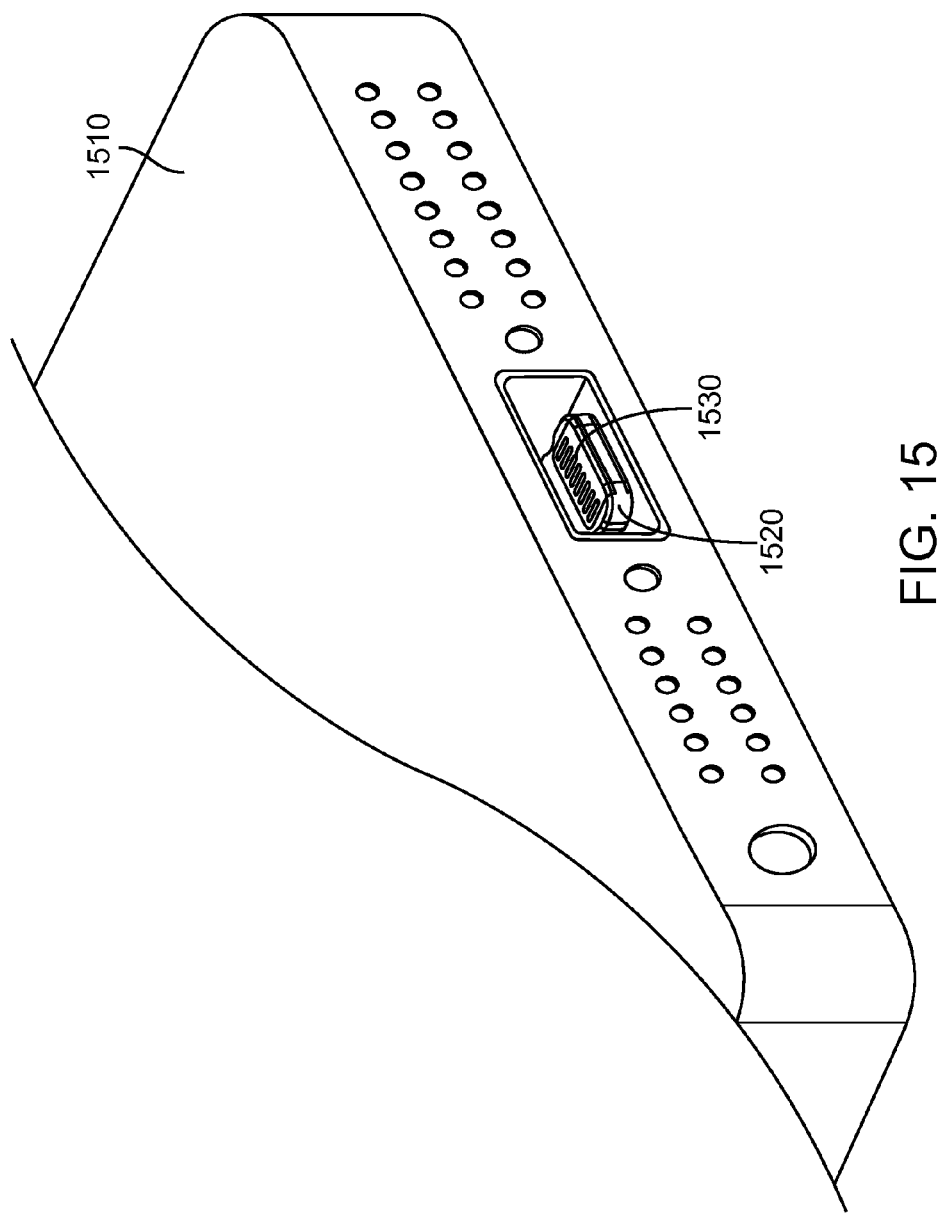
FIG. 15 illustrates an electronic device that is improved by the incorporation of an embodiment of the present invention.

FIG. 15 illustrates an electronic device that is improved by the incorporation of an embodiment of the present invention. This figure shows electronic device 1510 having a receptacle including tongue 1520, on which is located contacts 1530. Tongue 1520 and contacts 1530, as with the other tongues and contacts shown herein, may be made by embodiments of the present invention such as those including the techniques described herein. Tongue 1520 may be shaped to fit in a connector insert, while contacts 1530 may be arranged to mate with contacts in the connector insert.

In this example, tongue 1520 may be only a tongue, or it may be attached to a printed circuit board. For example, it may be attached to a relatively small circuit board that may further include one or more electronic devices, circuits, or components. In other embodiments of the present invention, a main printed circuit board for electronic device 1520 may include tongue such as tongue 1520. An example is shown in the following figure.

Figure 16:
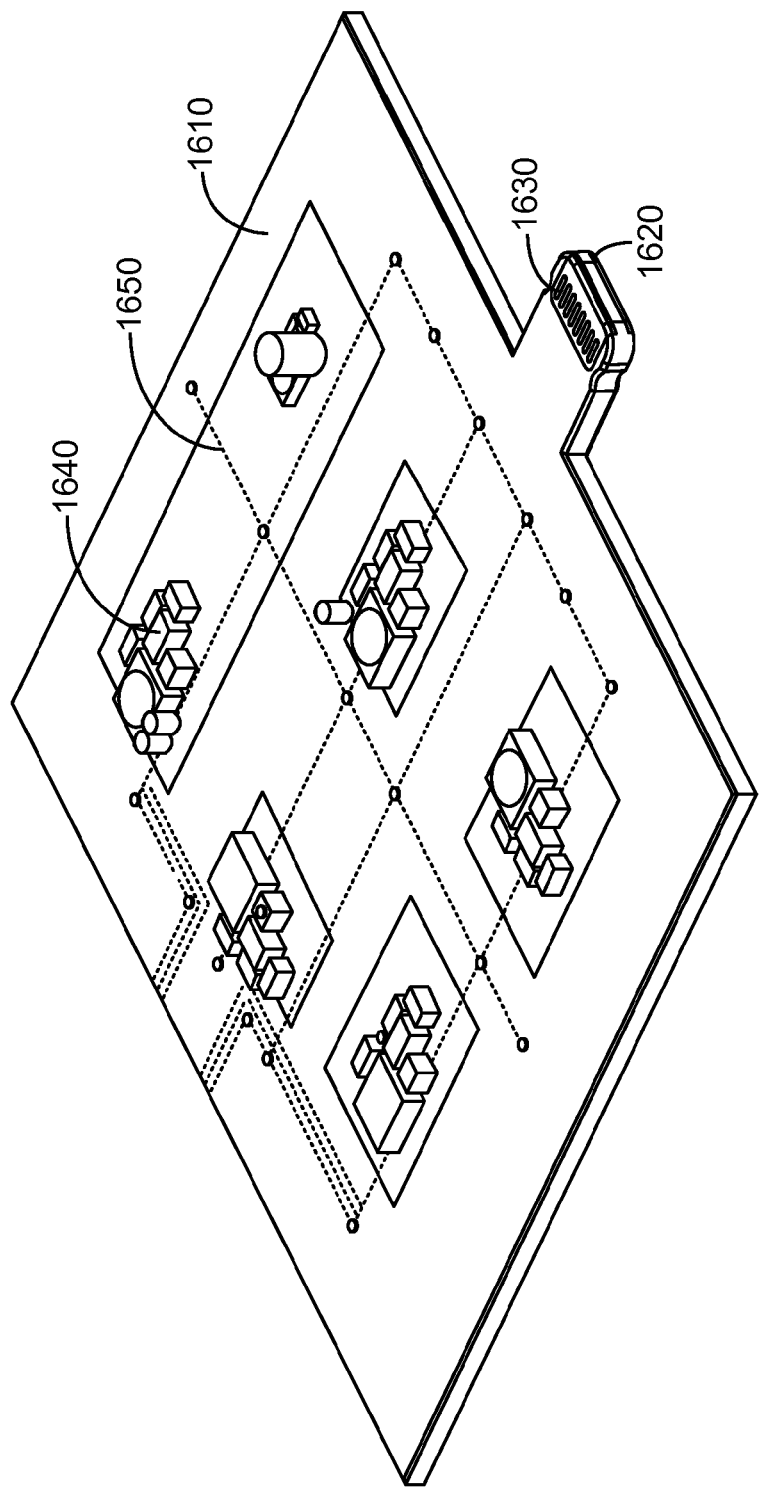
FIG. 16 illustrates a printed circuit board according to an embodiment of the present invention.

FIG. 16 illustrates a printed circuit board according to an embodiment of the present invention. Again, printed circuit board 1610 may be a main logic or printed circuit board in device 1510. Printed board 1610 may include one or more electronic devices, circuits, or components 1640 may be connected by traces 1650. Printed circuit board 1610 may have tongue portion 1620 that may include contacts 1630. Tongue portion 1620 may be arranged to fit in a connector insert, edge connector, or other socket. Contacts 1630 may be arranged to mate with contacts in the connector insert. Edges of printed circuit board 1610 may be chamfered around tongue or around the tongue and entire printed circuit board. Tongue portion 1620 may be relatively short compared to a side of the printed circuit board 1610 as shown, or tongue portion 1620 may extend for an entire side or for a substantial portion of a side of the printed circuit board 1610. Again, this and the other tongue and features, and printed circuit board portions and other structures, may be manufactured using the various techniques provided herein.

Being able to expose a printed circuit board to use and handling by user may also mean that one or more sides of an electronic device may be formed using a printed circuit. An example is shown in the following figure.

Figure 17:
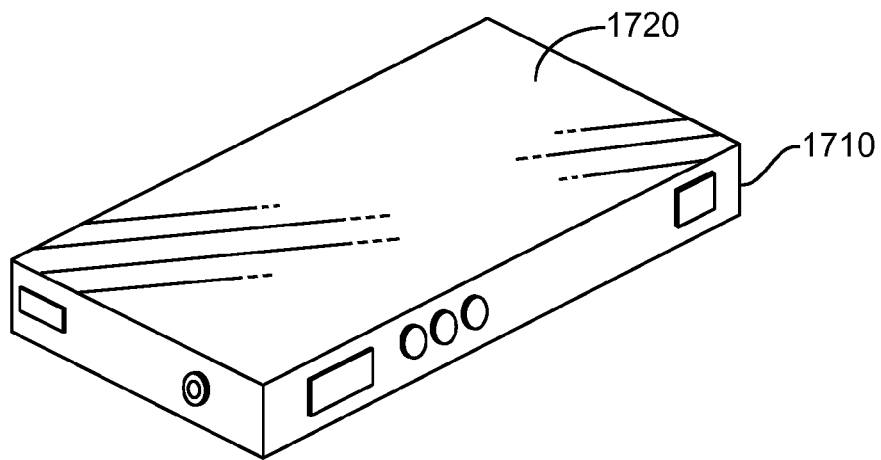
FIG. 17 illustrates an electronic device 1710 having a back side 1720 that may be formed of a printed circuit board.

FIG. 17 illustrates an electronic device 1710 having a back side 1720 that may be formed of a printed circuit board. Printed circuit board 1720 may support one or more electronic devices, circuits, or components, which may be located inside of electronic device 1710. Printed circuit board 1720, as with the other structures such as tongue 1520, tongue portion 1620, and the tongue showed below, may be manufactured using the methods shown herein and by using other embodiments of the present invention.

Again, embodiments of the present invention may provide connector inserts and tongues for connector receptacles. These inserts and tongues may include a ground or other isolation plane located on a middle or central layer of a printed circuit board. This ground plane may help to isolate signals connected to pads on a top surface from signals connected to pads on a bottom surface of the insert or tongue. An example is shown in the following figures.

Figure 18:
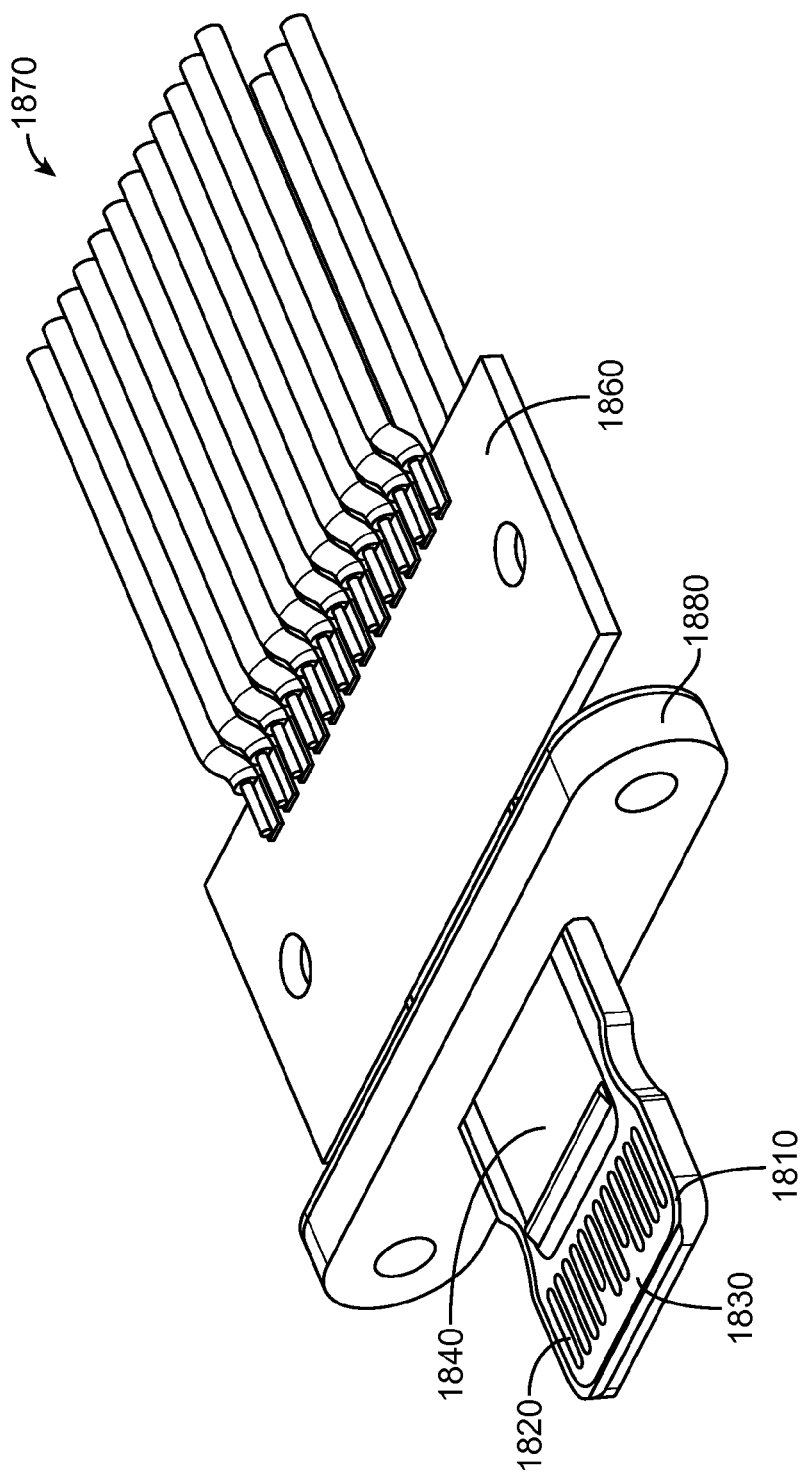
FIG. 18 illustrates a portion of a connector receptacle according to an embodiment of the present invention.

FIG. 18 illustrates a portion of a connector receptacle according to an embodiment of the present invention. This connector receptacle may be arranged to fit in an opening in a device enclosure and may include a tongue having ground band 1810, contacts 1820 surrounded by isolation area 1830, and ground pad 1840. The tongue portion may be mechanically supported by bracket 1880. Board 1860 may be formed with or separate from the tongue. Conductors 1870 may be used to electrically connect this receptacle portion to a main logic, motherboard, or other printed circuit board. The tongue may have a central ground plane. This central ground plane may be connected to either or both metal ground band 1810 and ground pad or ring 1840.

Figure 19:
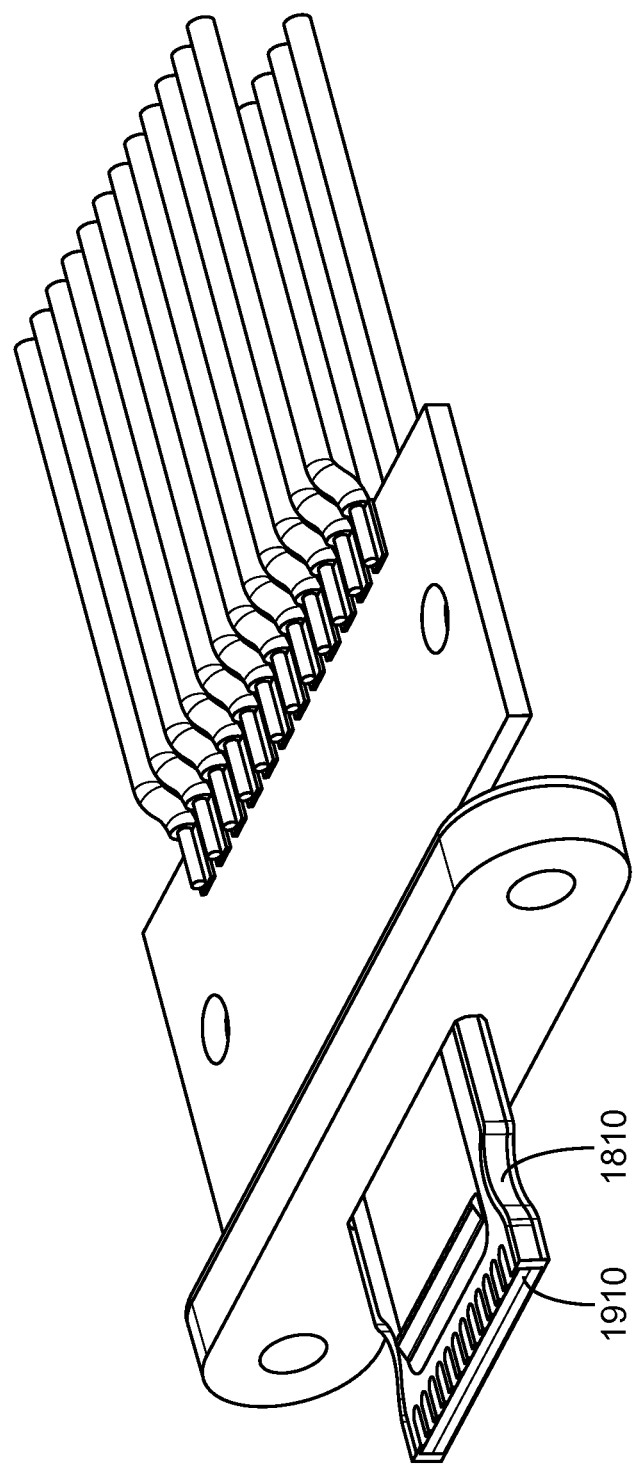
FIG. 19 illustrates a cutaway view of a portion of connector receptacle according to an embodiment of the present invention.

FIG. 19 illustrates a cutaway view of a portion of connector receptacle according to an embodiment of the present invention. Center ground plane 1910 may be electrically connected to the ground band 1810. The center ground plane 1910 may extent the edge of the printed circuit board and either directly contact plating on an edge of the printed circuit board and the attached metal ground band 1810, or it may connect through vias to the top and bottom ground pads or rings, such as ground pad or ring 1840 on the tongue.

Figure 20:
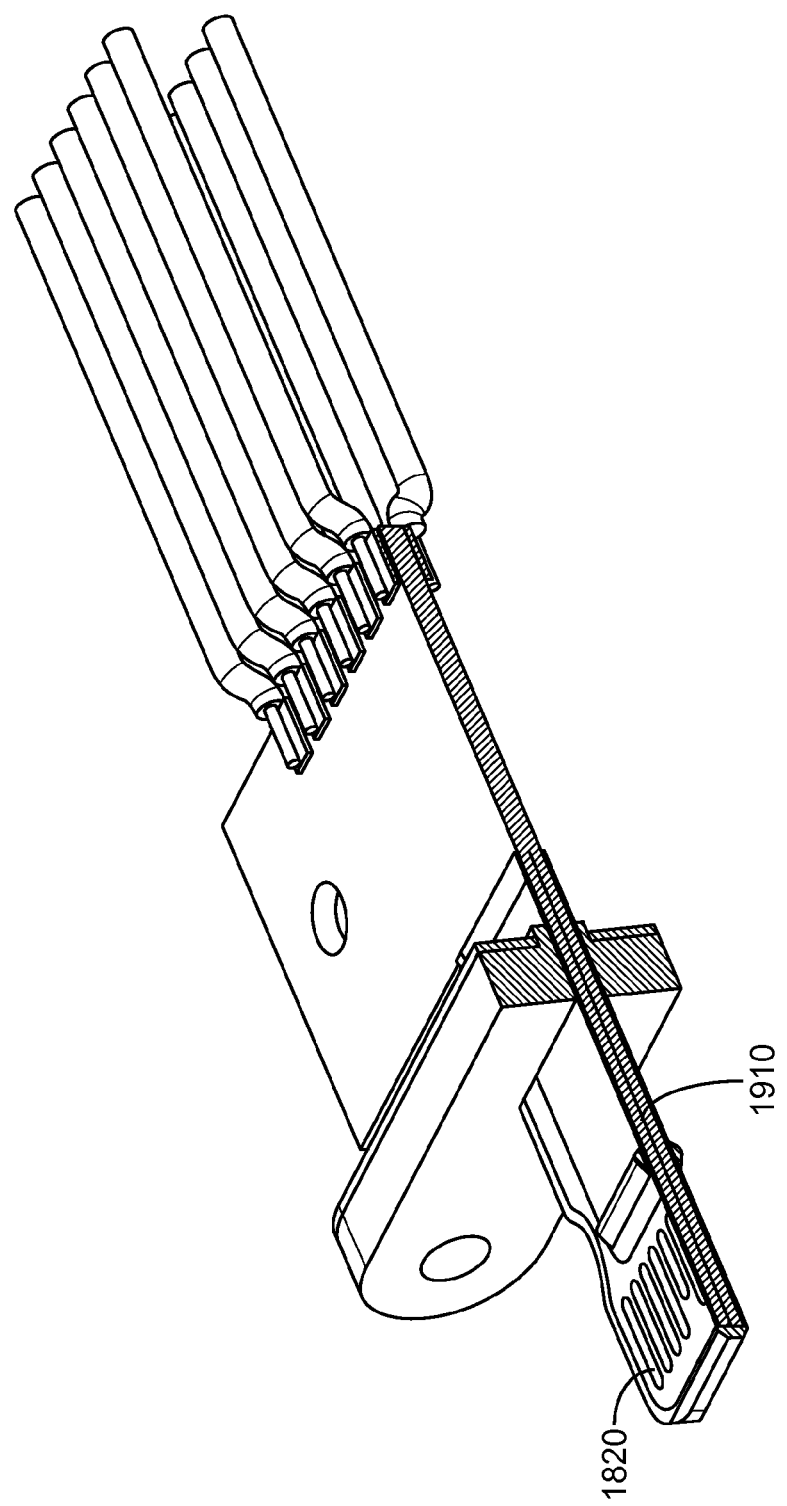
FIG. 20 illustrates a cutaway view of a portion of connector receptacle according to an embodiment of the present invention.

FIG. 20 illustrates a cutaway view of a portion of connector receptacle according to an embodiment of the present invention. Ground plane 1910 may isolate high-speed signals on the top and the bottom of the tongue to prevent cross talk. Ground planes, such as ground planes 1910, may also be located in the other tongues and inserts provided by the embodiments of the present invention.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector insert comprising:
   a printed circuit board having a top, a bottom, and a front;
   one or more electronic devices on the printed circuit board;
   a plurality of first contacts plated on the top of the printed circuit board;
   a ground ring around the plurality of first contacts and plated on the printed circuit board; and
   a plurality of traces routed in the printed circuit board to couple the plurality of first contacts to the one or more electronic devices,
   wherein the connector insert is shaped to fit in a corresponding connector receptacle such that the ground ring directly connects to ground contacts in the connector receptacle and each of the plurality of first contacts directly connect to a corresponding contact in a plurality of second contacts in the connector receptacle when the connector insert is mated with the connector receptacle.

2. The connector insert of claim 1 further comprising:
a plurality of second contacts plated on the bottom of the printed circuit board, the ground ring around the plurality of second contacts and forming a portion of a bottom surface of the connector insert.

3. The connector insert of claim 1 wherein the plurality of traces are routed on one or more layers in the printed circuit board.

4. The connector insert of claim 1 wherein at least two of the plurality of traces have matching impedances.

5. The connector insert of claim 1 wherein the printed circuit board comprises a central ground plane.

6. The connector insert of claim 5 further comprising a solder mask area between the plurality of first contacts and the ground ring.

7. The connector insert of claim 5 further comprising a coverlay between the plurality of first contacts and the ground ring.

8. The connector insert of claim 7 wherein edges between the top and the front and the bottom and the front of the connector insert are chamfered.

9. The connector insert of claim 1 wherein the ground ring is an outside surface of the connector insert.

10. A printed circuit board comprising:
one or more electronic devices on a main portion of the printed circuit board;
a connector tongue comprising a tongue portion extending from the main portion of the printed circuit board;
a plurality of first contacts plated on a top and bottom of the tongue portion of the printed circuit board;
ground regions plated on a left side and a right side of the tongue portion of the printed circuit board, the left side and the right side between the top and a bottom of the tongue portion of the printed circuit board, where the ground regions are an outside surface on the left side and the right side of the connector tongue; and
a plurality of traces routed in the printed circuit board to couple the plurality of first contacts to the one or more electronic devices,
wherein the tongue portion of the printed circuit board has chamfered edges between the top and a front of the tongue portion and between the bottom and the front, left, and right sides of the tongue portion of the printed circuit board, and
wherein the connector tongue is shaped to fit in a corresponding connector such that each of the plurality of first contacts directly connect to a corresponding contact in a plurality of second contacts in the corresponding connector when the connector tongue is mated with the corresponding connector.

11. The printed circuit board of claim 10 wherein the chamfered edges of the tongue portion of the printed circuit board form an outside surface of the of the connector tongue.

12. A connector comprising:
a printed circuit board having a central ground plane;
an electronic device located on the printed circuit board; and
a plurality of plated areas on the printed circuit board including a plurality of first contacts, a plurality of connections to the electronic device on the printed circuit board, and ground regions plated on a left side and a right side of the printed circuit board, the left side and the right side between a top and a bottom of the printed circuit board, where the ground regions are an outside surface on the left side and the right side of the connector,
wherein the printed circuit board is shaped to mate with a corresponding connector such that each of the plurality of first contacts directly connect to a corresponding contact in a plurality of second contacts in the corresponding connector when the connector is mated with the corresponding connector.

13. The connector of claim 12 further comprising:
a solder mask layer primarily covering non-plated areas of the printed circuit board.

14. The connector of claim 13 wherein the plurality of plated areas comprise a copper layer over the printed circuit board, wherein the copper layer is etched to form the plurality of first contacts, the ground regions, and the plurality of connections to the electronic device on the printed circuit board.

15. The connector of claim 14 wherein the plurality of plated areas comprise a nickel layer over the copper layer.

16. The connector of claim 15 wherein the plurality of plated areas comprise gold plating over the plurality of first contacts.

17. The connector of claim 16 wherein the plurality of plated areas comprise a metallic layer over the printed circuit board.

18. The connector of claim 17 wherein the metallic layer is formed of chromium.

19. The connector of claim 17 wherein the metallic layer is formed of palladium-nickel.

20. The connector of claim 12 wherein the printed circuit board comprises a central ground plane.

* * * * *

UNITED STATES PATENT AND TRADEMARK OFFICE
CERTIFICATE OF CORRECTION

PATENT NO.         : 9,992,863 B2
APPLICATION NO.    : 14/466899
DATED              : June 5, 2018
INVENTOR(S)        : Mahmoud R. Amini, Zheng Gao and Dennis R. Pyper Page 1 of 1

It is certified that error appears in the above-identified patent and that said Letters Patent is hereby corrected as shown below:

In the Claims

Column 11, Claim 10, Lines 42-43:
Delete ", left, and right sides"

Signed and Sealed this
Ninth Day of October, 2018

Andrei Iancu
*Director of the United States Patent and Trademark Office*